United States Patent [19]

Casteel et al.

[11] Patent Number: 4,633,241
[45] Date of Patent: Dec. 30, 1986

[54] METHOD OF AUTOMATED IN-PLACE SCR TESTING

[75] Inventors: Jordan B. Casteel, Charlottesville; John D. D'Atre, Earlysville; Allen M. Ritter, Charlottesville; Kenneth W. Wadding, Earlysville, all of Va.

[73] Assignee: General Electric Company, Charlottesville, Va.

[21] Appl. No.: 673,684

[22] Filed: Nov. 20, 1984

[51] Int. Cl.$^4$ ............................................. G08B 21/00
[52] U.S. Cl. .............................. 340/645; 324/158 D; 324/158 SC; 363/54
[58] Field of Search .................. 340/645, 653; 363/50, 363/52, 53, 54, 58; 361/100; 324/158 D, 158 SC

[56] References Cited

U.S. PATENT DOCUMENTS

| | | | |
|---|---|---|---|
| 3,879,652 | 4/1975 | Billings | 361/100 |
| 4,234,917 | 11/1980 | Suzuki et al. | 363/54 X |
| 4,400,657 | 8/1983 | Nola | 363/54 X |
| 4,412,160 | 10/1983 | Kojima et al. | 363/54 X |

Primary Examiner—James L. Rowland
Assistant Examiner—Daniel Myer
Attorney, Agent, or Firm—J. H. Beusse; I. M. Freedman

[57] ABSTRACT

An automated SCR cell test exercises each of the twelve SCRs in a dual, 3 phase, full wave SCR rectifier bridge singly to detect shorted SCRs and in pairs to detect open SCRs or faulty gate circuits.

5 Claims, 6 Drawing Figures

METHOD OF AUTOMATED IN-PLACE SCR TESTING

BACKGROUND OF THE INVENTION

The present invention relates to a method of testing controllable switching devices arranged in a full bridge configuration.

If a crane holding a heavy load in a stationary condition is commanded to move, the brake then released and the motor drive engaged, an open or shorted silicon controlled rectifier (SCR) present in a bridge supplying rectified power to the crane motor could then cause insufficient torque to be provided to support the load. To avoid this situation torque proving in cranes is usually accomplished before releasing the brake by commanding a low torque from the drive. The current regulator loop is checked to see if a predetermined level of armature current is developed.

A prior art method of checking an SCR bridge monitored the voltage across each of the cells of the bridge by measuring the three AC input voltages as well as the two DC output rails to check for a collapsing voltage when the cells were fired into the motor filter. This approach requires extra voltage sensors and will not detect an open cell in parallel with a good cell in a dual bridge configuration.

It is an object of the present invention to provide SCR test of SCRs arranged in a full bridge configuration which does not require any additional voltage or current sensors than those required for controlling the drive.

It is a further object of the present invention to provide a drive with improved maintainability capable of identifying open or short circuited SCRs.

It is a still further object of the present invention to provide a method of SCR testing that will detect open or short circuited SCRs in a dual bridge rectifier.

SUMMARY OF THE INVENTION

In one aspect of the present invention a method of detecting shorted controllable switching devices in a bridge rectifier supplying a load and being supplied by AC power is provided. The method comprises the steps of first detecting the zero crossings of a voltage of the AC supply, and sequentially switching each of the controllable switching devices to the conductive state before the zero crossing of the voltage associated with the forward conduction of the controllable switching device, so that only one switching device is switched at a time. Next, the DC output voltage of the rectifier is measured after each of the controllable switching devices is switched to the conductive state. An indication of a shorted controllable switching device is provided when the DC output voltage is measured after each of the controlled switching devices is switched to the conductive state.

In another aspect of the present invention a method of detecting an open circuit controllable switching device in a bridge rectifier supplying a load, with the bridge rectifier being supplied by AC power, is provided. The method comprises the steps of detecting the zero crossings of a voltage of the AC power and sequentially commanding pairs of controllable switching devices to switch to a conductive state, with each pair of controllable switching devices corresponding to a pair of switching devices conducting at the same time when a rectifier is operating in a line commutated mode. Next, the current flow in the load or AC lines after commanding pairs of switching devices to the conductive state is measured. An indication of an open circuit in the controllable switching device is provided after a pair of switching devices is commanded to switch to the conductive state and an absence of current flow is measured.

BRIEF DESCRIPTION OF THE DRAWING

The features of the invention believed to be novel are set forth with particularity in the appended claims. The invention itself, both as to organization and the method of operation, together with further objects and advantages thereof, may best be understood by reference to the following description taken in conjunction with the accompanying drawing in which:

DETAILED DESCRIPTION OF THE INVENTION

Figure 1:
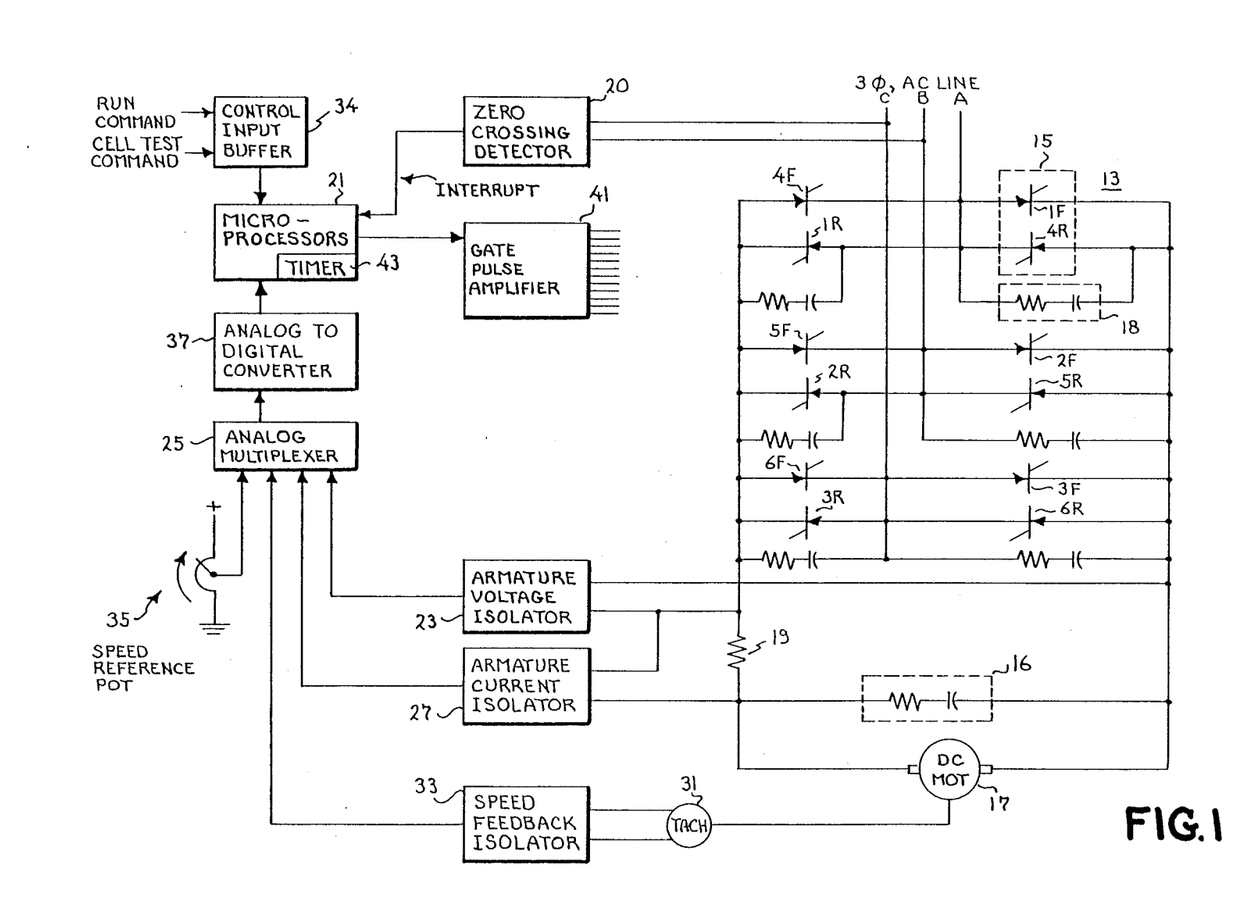
FIG. 1 is a part schematic part block diagram representation of a DC motor drive system in accordance with the present invention.

Referring now to the drawing, and particularly FIG. 1 thereof, there is shown a DC motor drive system. A dual three phase full wave silicon controlled rectifier bridge 13 includes 12 silicon controlled rectifiers (SCRs) comprising 6 SCR packages 15 containing 2 SCRs each. The dual rectifier bridge 13 is coupled to a three phase AC power source which line commutates the SCRs. SCRs designated 1F through 6F are coupled together to form a first full wave bridge rectifier. SCRs 1F and 4F are connected in series between the DC output rails with the junction of the SCRs coupled to phase A of a three phase AC power source. SCRs 2F and 5F are connected in series between the DC output rails, with the junction of the SCRs coupled to phase B of the three phase AC power source. SCRs 3F and 6F are connected in series between the DC output rails with the junction of the SCRs coupled to phase C of the three phase AC power source. SCRs designated 1R through 6R are coupled together to form a second full wave bridge rectifier. SCRs 1R and 4R are connected in series between the DC output rails with the junction of the SCRs coupled to phase A of the three phase AC power source. SCRs designated 2R and 5R are connected in series between the DC output rails with the junction of the SCRs coupled to phase B of the external three phase AC power source. SCRs designated 3R and 6R are connected in series between the DC output rails with the junction of the SCRs coupled to phase C of the external three phase AC power source. The DC output of the dual rectifiers is coupled to a DC motor 17 through a shunt 19. When forward motor torque is desired SCRs in the first bridge are fired using the firing order 1F, 6F, 2F, 4F, 3F and 5F with successive pairs of SCRs conductive at the same time (e.g. 5F and 1F, 1F and 6F) and when reverse motor rotation is desired the SCRs in the second bridge are fired using the firing order 1R, 6R, 2R, 4R, 3R and 5R resulting in an opposite DC voltage on the DC rail compared to the voltage obtained when the SCRs in the forward bridge are fired. Snubber 18 comprises a series connected resistor and capacitor connected in parallel across the SCRs in each module. A DC filter 16 is connected across the motor to damp the DC link to prevent oscillations.

An analog zero crossing detector circuit 20 is coupled by high resistance isolation to 2 of the 3 phase AC lines and provides an interrupt signal to a microprocessor 21 when a zero crossing of the phase to phase voltage is detected. Microprocessor 21 can comprise a plurality of Intel 8031 microcomputers. An armature voltage isolator 23 is coupled across the output of the dual rectifier bridge 13 and provides a filtered analog signal to an analog multiplexer 25. An armature current isolator is coupled across shunt 19. Alternatively, current can be measured by using current transformers in two of the three AC lines. Armature current isolator 27 provides an analog signal proportional to armature current to analog multiplexer 25. Tachometer 31 is driven by DC motor 17. The output signal from the tachometer is coupled to a speed feedback isolator 33 which provides an analog signal to analog multiplexer 25. The output of the speed reference potentiometer 35 is also coupled to analog multiplexer 25. Analog to digital converter 37 couples the output of the analog multiplexer 25 to microprocessor 21. A run command and a cell test command signal are coupled through a control input buffer 39 to microprocessor 21. The term cell is used in this application to refer to the controllable switching devices in the rectifier, namely, SCRs. Microprocessor 21 provides gate pulse signals to gate pulse amplifier 41 which in turn are coupled to the gates of the 12 SCRs in dual bridges 13. A firing timer 43, which is part of microprocessor 21 provides an interrupt when the counter overflows, indicative of the next SCR firing time.

Figure 2:
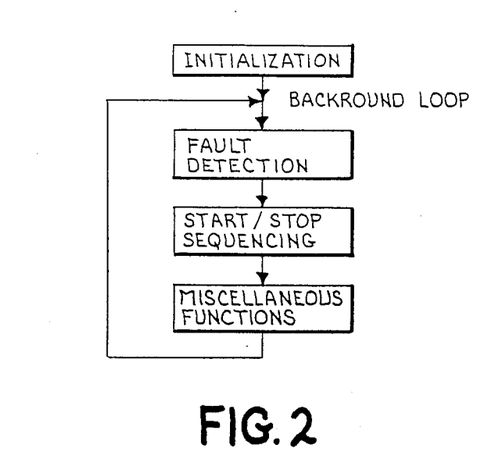
FIG. 2 is a flow chart representation of a background loop routine run by a microprocessor in FIG. 1.

The operation of the circuit of FIG. 1 will now be explained. Referring to FIG. 2 a flow chart for a background loop is shown. When the drive system is first activated or reset the initialization routine tests the microprocessor's ROM, RAM, EPROM, sets up the real time clock and loads a firing time into the firing timer. A fault detection routine checks for phase loss and AC and DC overcurrent. A Start/Stop sequencing routine controls the maximum acceleration and deceleration and jog capability.

Figure 3:
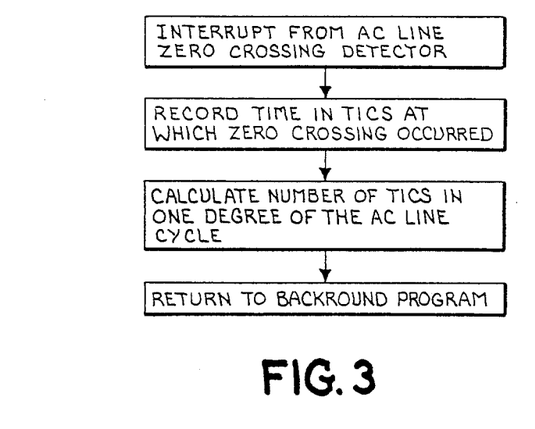
FIG. 3 is a flow chart of representation a routine called after an AC line zero crossing is detected and run by a microprocessor in FIG. 1.

When the zero crossing detector 20 of FIG. 1 detects a zero crossing of phase to phase voltage, an interrupt is sent to microprocessor 21 and the zero crossing interrupt routine shown in FIG. 3 is called. The zero crossing time is recorded in terms of a counter run by a microcomputer clock. Each count of the counter is referred to as a tic. The number of tics in one degree of the AC line cycle is determined by dividing the number of tics between zero crossings by 360. Once the zero crossing detection routine is completed, execution of the background routine resumes.

Figures 4, 4B:
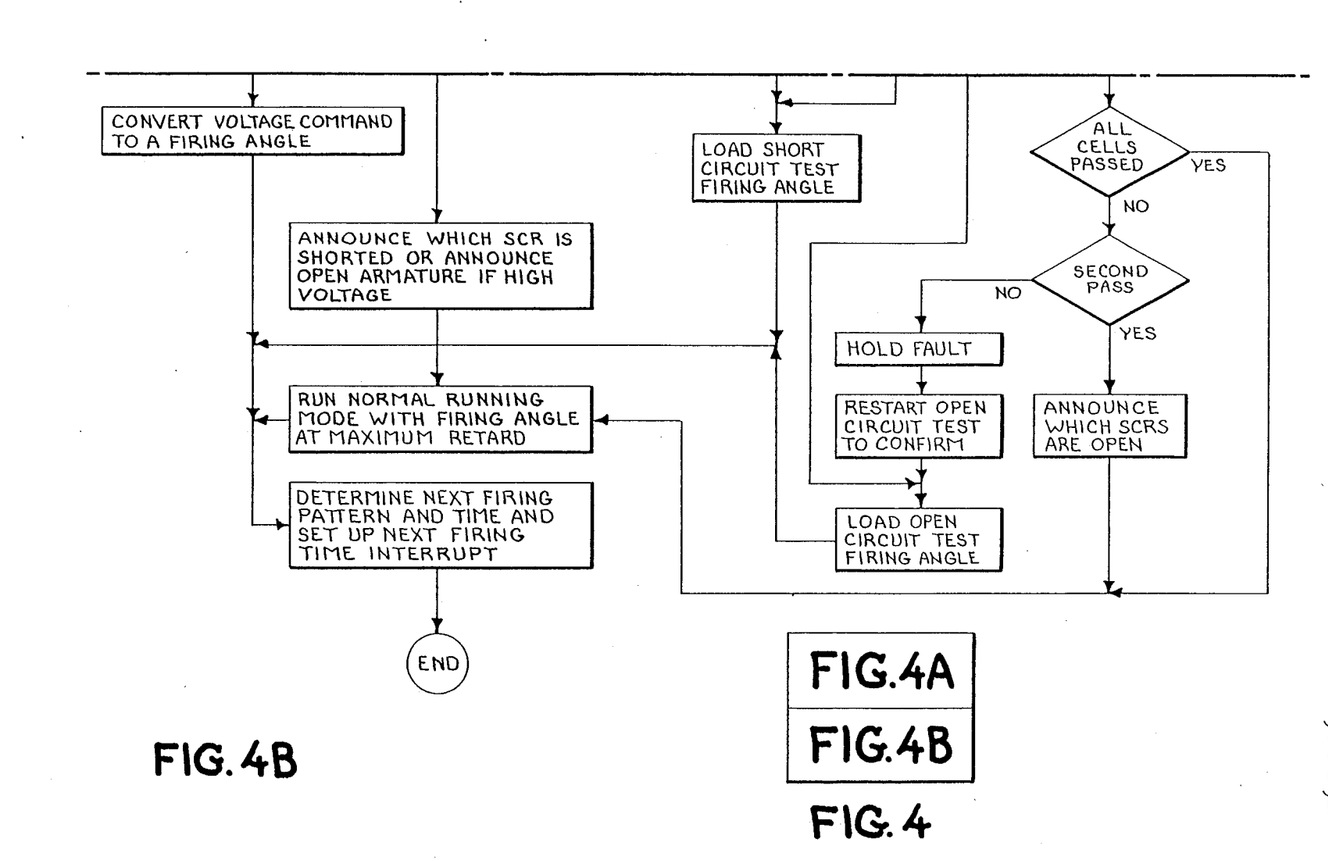
FIG. 4 is a flow chart representation of the routine run by a microprocessor in FIG. 1; and called when a firing timer times out.
Figure 4A:
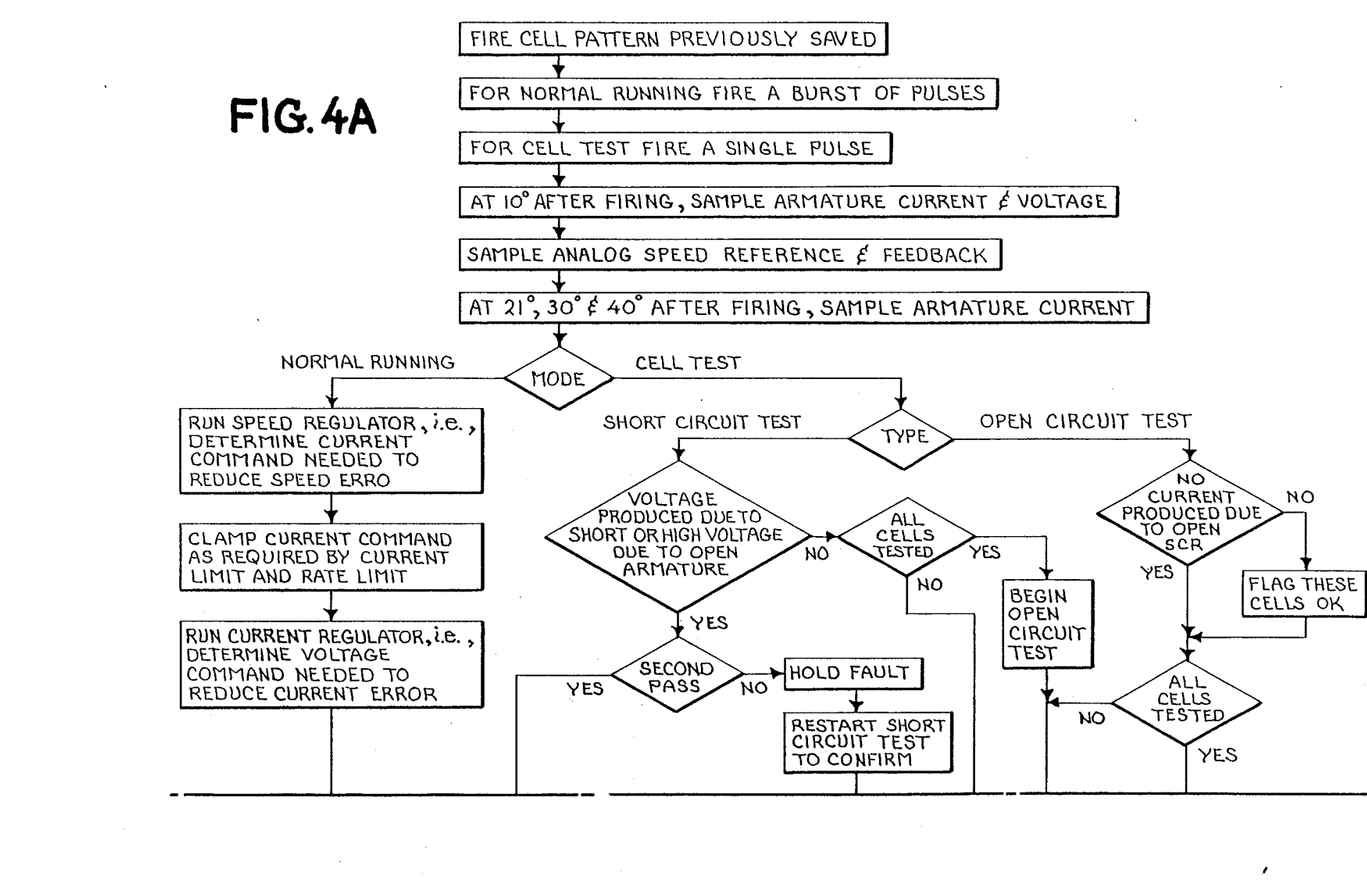

When the firing timer 43 overflows (the timer is incremented regularly) it causes the routine in FIG. 4 to be executed. The first time this routine is run, the normal running mode pattern is used at an angle of maximum retard wtih the first gating pulses not being coupled to the SCRs. At ten degrees after firing, the armature current and voltage are sampled. At 21, 30 and 43 degrees the armature current is again sampled.

Figure 5:
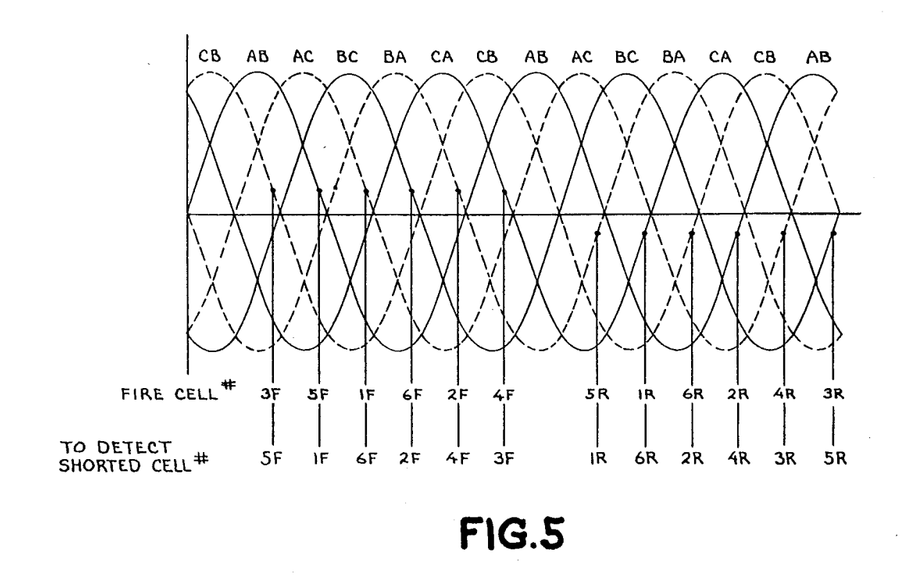
FIG. 5 is a waveform diagram showing the order of firing and firing angles of SCRs in a rectifier bridge supplying the DC motor of FIG. 1, when the SCRs are checked for short circuits.

The mode is next determined depending on whether this is a torque proving start, a start without torque proving or the cell test mode has been selected by an operator. If in the cell test mode or a torque proving start, the type of test, short or open circuit, is determined. The short circuit test is run first. Since a cell has not been fired, there is no voltage produced due to a short circuit and all the cells have not yet been tested. A short circuit test firing angle is loaded to be used later in setting up the firing timer, the angle loaded is about 15 degrees before the zero crossing of the phase to phase voltage associated with the SCR to be fired. The appropriate firing pattern is shown in FIG. 5 assuming the test starts with SCR 3F associated with phase to phase voltage CB. The object of the short circuit test is to discover whether there are any shorted SCRs in either bridge and indicate the findings. The SCR that begins the test depends on what the system command direction is and when the next cell to be fired is determined relative to the phase voltages of the three phase AC power line. Whichever SCR starts the test, the test continues until all SCRs in one bridge are fired before beginning the sequence for the other bridge. When the firing pattern has been selected and the firing timer loaded, the routine in FIG. 4 is not called again until the timer overflows. The background routine is again run with zero crossing interrupts handled as necessary.

Assuming the test starts with SCR 3F as shown in FIG. 5, SCR 3F will be gated with a single pulse. At ten degrees after the firing, the armature current, or alternatively line currents if current transformers are connected to two of the three AC lines, and voltage are sampled with the armature voltage being used in the short circuit test as hereinafter described. The analog speed reference and feedback from the tachometer are read but not used during the short circuit test. At 21, 30 and 43 degrees after firing, the armature current in the shunt is sampled but not used in the short circuit test. The voltage measured at ten degrees after firing which is close to the phase to phase voltage zero crossing is compared to a threshold value to see of any voltage appears across the motor which would indicate a shorted SCR.

There are two possibilities of current being generated as a result of one cell being shorted somewhere in the dual bridge besides the SCR that has just been gated. Current could flow directly from the gated SCR to the shorted SCR on the same side of the motor and out to the power supply, in which case a short circuit would be detected when the appropriate SCR on the opposite side of the motor is fired, or it could flow from the gated SCR through the motor through the shorted SCR and out to the 3 phase power source. In the second situation the voltage across the motor would be detected. For example, consider a possible current path when SCR 1F is gated on during phase to phase voltage AC. If SCR 3F or 6R were shorted, the current would flow directly from phase A, through SCR 1F through the motor, and then through 6F or 3R and out into phase C. The shorted cell is detected by measuring the filtered voltage across the motor at or near the phase to phase voltage zero crossing after cross firing. Any voltage measured above a small threshold to allow for electrical noise indicates a short. When a fault is detected, a look up table based on the cell fired is used to determine the correct fault code which is saved. The short circuit test is repeated to reinforce the findings of the first test when a fault is detected. The test is repeated by restarting the test with the next cell and continuing until twelve cells have been gated. FIG. 5 also shows the shorted cell detected depending on which cell is fired. To ensure that shorted cells having a different impedance in the forward and reverse biased direction are detected, all twelve SCRs are gated.

If the same fault is detected on the second pass, the pair of cells in the fault code are announced, the test stopped and the drive not permitted to run. The fault detection routine in the background program of FIG. 3 interrupts AC power supplied to the dual bridge 13. Another fault condition checked during the short circuit test is for very high voltage readings which occur when there is no motor armature connected to the rectifier circuit. The high voltages are developed because of the capacitors in the snubber circuits across each SCR. A very high short circuit test reading is therefore interpreted as an open armature circuit and indicated as such. If all twelve cells are checked in a single pass without any fault indications then the open circuit test begins on the next pass through the code.

Figure 6:
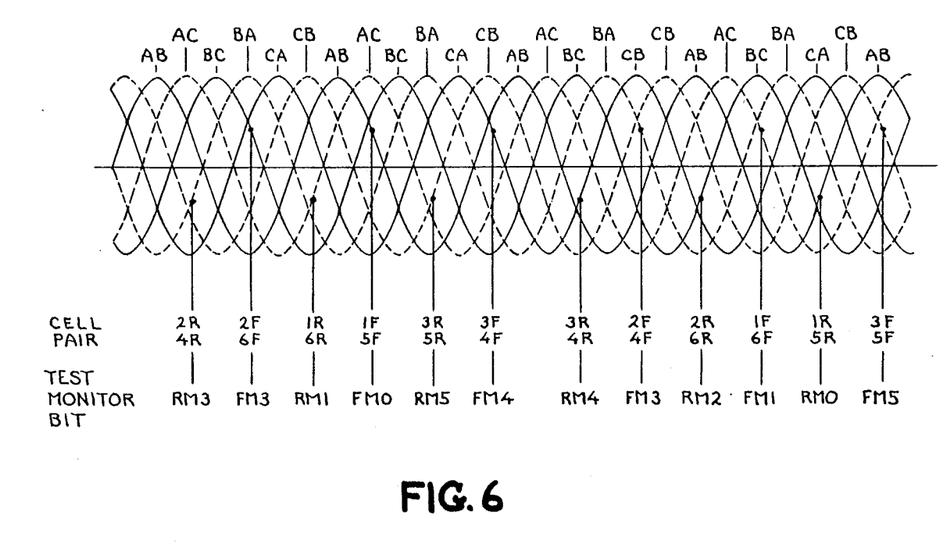
FIG. 6 is a waveform diagram showing the firing order and firing angle of SCRs in the rectifier bridge of FIG. 1 when checked for open circuit SCRs.

The open circuit test firing angle is loaded so that it may be used in setting up the next firing time interrupt. A firing angle of 25 or 37 degrees (selectable by the user) before the sine wave zero crossing of each SCR pair is used. The two different angles are made available because of the variation of motor impedance over the horsepower range for which the drive is intended to be used. In a drive with a low impedance the firing angle of 25 degrees before the zero crossing would provide less current than the firing angle of 37 degrees. Gating the SCRs at one of the two angles chosen causes current to be forced through the motor. The firing pattern for the open circuit test is shown in FIG. 6 with the normal pairs of cells that are conductive at the same time in normal motor operation gated in pairs in alternating forward and reverse SCR pattern until all twelve possible combinations of cells that are conducting at the same time have been gated once. The beginning SCR pair in the open circuit test is the first pair available based on the relative phase to phase voltages of the three phase AC power after the short circuit test has been completed. At or near the zero crossing of the sine wave the armature current is measured by sampling the armature current at 21 and 30 degrees after the initialization of firing and averaging the values obtained. The average values are compared to a threshold value. If current is detected then the test for the particular SCR pair just gated has passed and a corresponding bit is set in one of the two open circuit test monitor memory bytes.

After all 12 open circuit test pairs have been gated and the current measured, the test monitor memory bytes contain a pattern of 1's and 0's that correspond to passed and failed tests. From this pattern the open cell or cells can be deduced. For example, if the pattern 011110 appears in the forward monitor memory byte, test numbers FM0 and FM5 have failed. This indicates that SCR5F is failed open or a problem exists in the gating circuit for that cell. The bits in the forward and reverse monitor bytes are numbered from 0 to 7, right to left. Bits 6 and 7 are not used. See FIG. 6 for corresponding cell pair to test monitor bit numbers. A problem with any one of the 12 SCR's or combinations of 2 SCRs in either bridge can be uniquely determined from look-up tables based on the patterns in the forward and reverse test monitors. Some patterns provide inconclusive information except that there are multiple failures in the power bridges or that all forward or all reverse cells are open.

After the short circuit and open circuit tests have been successfully completed, the normal running mode with firing angle at maximum retard is selected if a cell test has been completed as selected by the operator. The SCRs are continuously fired at maximum retard until the drive is turned off. The firing timer is loaded with a maximum retard angle and the routine of FIG. 4 will be called when the timer overflows. When the routine of FIG. 4 is again called, a burst of pulses is sent to the SCRs. At 10 degrees after firing is initiated, the armature current and voltages are sampled. The analog speed command from the potentiometer 35 is sampled as well as the tachometer. At 21, 30 and 43 degrees after initiating the firing the armature current is sampled. If a torque proving mode has been selected the normal running mode then runs the speed regulator routine which determines the current command needed to reduce the speed error. The measured current is determined from the average of the 10, 21, 30 and 43 degree armature current samples which gives a measure of the average current in the motor. The current command determined by the speed regulator is clamped as required by a current and rate limit. A current regulator routine is run to determine a voltage command needed to reduce the current error. The voltage command is converted into a firing angle and the firing pattern for normal operation in a desired direction is saved and the firing timer is loaded to achieve the desired firing angle.

The foregoing describes a method of automated in-place SCR testing that does not require any additional voltage or current sensors other than those required for drive operation and can detect open and shorted SCRs in dual bridge rectifiers.

While the invention has been particularly shown and described with reference to a preferred embodiment thereof, it will be understood by those skilled in the art at various changes in form and details may be made therein without departing from the spirit and scope of the invention.

What is claimed is:

1. A method of detecting shorted controllable switching devices in a bridge rectifier supplying a load, the bridge rectifier being supplied by an AC source, the method comprising the steps of:

detecting the zero crossings of the AC source voltage;

sequentially switching each of the controllable switching devices of the rectifier to the conducting state, before the zero crossing of the AC source voltage associated with the forward conduction of the controllable switching device, so that only one controllable switching device is intended to be conductive at a time;

measuring the DC output voltage of the rectifier after each of the controllable switching devices is switched to the conductive state; and providing an indication of a shorted controllable switching device when the DC output voltage measured after any of the controllable switching devices is switched to the conductive state is greater than a predetermined value.

2. A method of detecting open circuit controllable switching devices in a bridge rectifier supplying a load, the bridge rectifier being supplied by an AC source, the method comprising the steps of:

detecting the zero crossings of an AC source voltage;

sequentially switching pairs of controllable switching devices, with each pair corresponding to a pair of switching devices conducting at the same time when a rectifier is operating in a line commutated mode;

measuring the current flow in the load after commanding a pair of controllable switching devices to the conductive state; and     providing an indication of an open circuit controllable switching device upon the detection of an absence of current after any of the pairs of controllable switching devices were commanded to the conductive state.

3. A method of detecting shorted controllable switching devices in a full bridge rectifier supplying a load, the full bridge rectifier being supplied by a three phase AC source, the method comprising the steps of:

detecting the zero crossings of a phase to phase voltage of the three phase AC source;

sequentially switching each of the controllable switching devices of the rectifier to the conducting state, before the zero crossing of the phase to phase voltage associated with the forward conduction of the controllable switching device, so that only one controllable switching device is intended to be conductive at a time;

measuring the DC output voltage of the rectifier after each of the controllable switching devices is switched to the conductive state; and     providing an indication of a shorted controllable switching device when the DC output voltage measured after any of the controllable switching devices is switched to the conductive state is greater than a predetermined value.

4. A method of detecting open circuit controllable switching devices in a full bridge rectifier supplying a load, the full bridge rectifier being supplied by a three phase AC source, the method comprising the steps of:

detecting the zero crossings of a phase to phase voltage of the 3 phase AC source;

sequentially switching pairs of controllable switching devices, with each pair corresponding to a pair of switching devices conducting at the same time when a rectifier is operating in a line commutated mode;

measuring the current flow in the load after commanding a pair of controllable switching devices to the conductive state; and     providing an indication of an open circuit controllable switching device upon the detection of an absence of current after any of the pairs of controllable switching devices were commanded to the conductive state.

5. A method of detecting open circuit controllable switching devices in a dual bridge rectifier supplying a load, the dual bridge rectifier being supplied by a three phase AC source, the method comprising the steps of:

detecting the zero crossings of a phase to phase voltage of the 3 phase AC source;

sequentially switching pairs of controllable switching devices, alternating between pairs of controllable switching devices in the first and second bridges of the dual bridge, each pair of controllable switching devices corresponding to a pair of switching devices in the first bridge and second bridge normally conducting at the same time when a rectifier is operating in a line commutated mode;

measuring the current flow in the load after commanding a pair of controllable switching devices to the conductive state; and     providing an indication of an open circuit controllable switching device upon the detection of an absence of current after any of the pairs of controllable switching devices were commanded to the conductive state.

\* \* \* \* \*